United States Patent
Margalit et al.

(10) Patent No.: US 10,833,702 B1
(45) Date of Patent: Nov. 10, 2020

(54) INTERPOLATION SEARCH TO FIND ARBITRARY OFFSETS IN A COMPRESSED STREAM

(71) Applicant: International Business Machines Corporation, Armonk, NY (US)

(72) Inventors: Amit Margalit, Hod-Hasharon (IL); Ovadi Somech, Rishon LeZion (IL); Eran Tzabari, Tel Aviv (IL); Eliran Zada, Rosh Haayin (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/576,259

(22) Filed: Sep. 19, 2019

(51) Int. Cl.
  *H03M 7/30* (2006.01)
  *G06F 17/18* (2006.01)
(52) U.S. Cl.
  CPC .......... *H03M 7/3064* (2013.01); *G06F 17/18* (2013.01); *H03M 7/60* (2013.01)
(58) Field of Classification Search
  CPC ........ H03M 7/60; H03M 7/3064; G06F 17/18
  USPC ..................................................... 341/50–90
  See application file for complete search history.

(56) References Cited

U.S. PATENT DOCUMENTS

| | | | |
|---|---|---|---|
| 5,510,838 A * | 4/1996 | Yomdin | H04N 19/54 348/384.1 |
| 5,598,217 A | 1/1997 | Yamaguchi | |
| 5,835,029 A * | 11/1998 | Fujiwara | H04N 9/28 341/50 |
| 6,005,582 A * | 12/1999 | Gabriel | G06T 11/40 345/586 |
| 6,278,734 B1 | 8/2001 | Geib et al. | |
| 8,520,143 B2 | 8/2013 | Norman et al. | |
| 10,341,643 B2 | 7/2019 | Routhier et al. | |
| 2004/0035005 A1 | 2/2004 | Huang et al. | |
| 2008/0175415 A1* | 7/2008 | Kunimoto | G11B 27/034 381/119 |

(Continued)

FOREIGN PATENT DOCUMENTS

| CN | 101668196 A | 3/2010 |
|---|---|---|
| KR | 20040035055 A | 4/2004 |

OTHER PUBLICATIONS

Interpolation Search Geeksforgeeks [https://www.geeksforgeeks.org/interpolation-search/] [accessed Jul. 30, 2019] 10 Pages.

(Continued)

*Primary Examiner* — Lam T Mai
(74) *Attorney, Agent, or Firm* — Patterson + Sheridan, LLP

(57) ABSTRACT

Interpolated search is provided for navigating a compressed file to identify a desired offset in an uncompressed version of the file by: determining a low point and a high point in an uncompressed version of a stream corresponding to a compressed version of the stream that is divided into a plurality of chunks; calculating an average compression ratio between the low point and the high point; interpolating a position in the compressed version of a desired offset in the uncompressed version to identify a bifurcation chunk of the plurality of chunks that includes the interpolated position; reading an offset of the bifurcation chunk; and in response to determining that the desired offset is within a threshold distance of the offset of the bifurcation chunk, decompressing the compressed version from the bifurcation chunk until the desired offset is output.

20 Claims, 6 Drawing Sheets

(56) References Cited

U.S. PATENT DOCUMENTS

2014/0018106 A1* 1/2014 Fulger ................. G08G 1/0967
　　　　　　　　　　　　　　　　　　　　455/456.3
2019/0096027 A1* 3/2019 Fielding ............. G06F 12/0811

OTHER PUBLICATIONS

Interpolation Search—Wikipedia [https://en.wikipedia.org/wiki/interpolation_search] [Jul. 30, 2019] 4 Pages.

Abhishek Tudu, "What Is the Time Complexity of Interpolation Search and Why?," [https://www.quora.com/what-is-the-time-complexity-of-interpolation-search-and-why] [Accessed Jul. 30, 2019] 3 Pages.

* cited by examiner

INTERPOLATION SEARCH TO FIND ARBITRARY OFFSETS IN A COMPRESSED STREAM

BACKGROUND

The present invention relates to search algorithms, and more specifically, to searching a compressed stream of data. When data in a file are compressed, the data are divided into several "chunks" that describe the original (uncompressed) file using patterns within the original data to reduce the number of bits needed to represent the file in a compressed form. The compressed form of the file may be stored on various storage media, and various algorithms may be used to compress the file according to different patterns, chunk sizes, etc. To find data in the compressed version of the file at a desired offset within the original file (e.g., at position n within an original file of N bytes), the user can decompress the file and read data from the compressed file until the desired offset is seen (e.g., by decompressing and reading the output from $byte_0$ to $byte_n$), which is computationally expensive. Alternatively, a user can develop an index matching compressed offsets with uncompressed offsets in the respective compressed and uncompressed versions of the file (e.g., positions $k_0$, $k_1$, $k_2$, etc. in the K compressed bytes corresponding to positions $n_0$, $n_1$, $n_2$, etc. in the N uncompressed bytes), which allows the user to decompress and read fewer bytes when searching for a desired offset in the uncompressed file within the compressed file, but reduces the space savings on the storage media offer by compression by requiring space to store the index or forcing a correlation (e.g. a formula correlating n:k) that can affect the strength of the compression algorithm.

SUMMARY

According to one embodiment of the present invention, a method for interpolation search to find arbitrary offsets in a compressed stream is provided, the method comprising: determining a low point and a high point in an uncompressed version of a stream corresponding to a compressed version of the stream that is divided into a plurality of chunks; calculating an average compression ratio between the low point and the high point; interpolating a position in the compressed version of a desired offset in the uncompressed version to identify a bifurcation chunk of the plurality of chunks that includes the interpolated position; reading an offset of the bifurcation chunk; and in response to determining that the desired offset is within a threshold distance of the offset of the bifurcation chunk, decompressing the compressed version from the bifurcation chunk until the desired offset is output. In some embodiments the method further comprises before determining the low point and the high point: determining an initial low point and an initial high point in the compressed version, wherein the initial low point is an beginning chunk of the plurality of chunks and the initial high point is a final chunk of the plurality of chunks; calculating an initial average compression ratio between the initial low point and the initial high point; interpolating an initial position in the compressed version of the desired offset in the uncompressed version to identify an initial bifurcation chunk that includes the initial interpolated position; reading an initial offset of the initial bifurcation chunk; and in response to determining that the desired offset is not within the threshold distance of the initial offset and the initial offset being closer to the initial low point than the desired offset is to the initial low point, updating the initial low point to the initial offset as a subsequent low point. In some embodiments the method further comprises, before determining the low point and the high point: determining an initial low point and an initial high point in the compressed version, wherein the initial low point is an beginning chunk of the plurality of chunks and the initial high point is a final chunk of the plurality of chunks; calculating an initial average compression ratio between the initial low point and the initial high point; interpolating an initial position in the compressed version of the desired offset in the uncompressed version to identify an initial bifurcation chunk that includes the initial interpolated position; reading an initial offset of the initial bifurcation chunk; and in response to determining that the desired offset is not within the threshold distance of the initial offset and the initial offset being closer to the initial high point than the desired offset is to the initial high point, updating the initial high point to the initial offset as a subsequent high point.

According to one embodiment of the present invention, a system for interpolation search to find arbitrary offsets in a compressed stream is provided, the system, comprising: a processor; and a memory storage device including instructions that when executed by the processor enable the system to: determine a low point and a high point in an uncompressed version of a stream corresponding to a compressed version of the stream that is divided into a plurality of chunks; calculate an average compression ratio between the low point and the high point; interpolate a position in the compressed version of a desired offset in the uncompressed version to identify a bifurcation chunk of the plurality of chunks that includes the interpolated position; read an offset of the bifurcation chunk; and in response to determining that the desired offset is within a threshold distance of the offset of the bifurcation chunk, decompress the compressed version from the bifurcation chunk until the desired offset is output. In some embodiments, the system is further enabled to, before determining the low point and the high point: determine an initial low point and an initial high point in the compressed version, wherein the initial low point is an beginning chunk of the plurality of chunks and the initial high point is a final chunk of the plurality of chunks; calculate an initial average compression ratio between the initial low point and the initial high point; interpolate an initial position in the compressed version of the desired offset in the uncompressed version to identify an initial bifurcation chunk that includes the initial interpolated position; read an initial offset of the initial bifurcation chunk; and in response to determining that the desired offset is not within the threshold distance of the initial offset and the initial offset being closer to the initial low point than the desired offset is to the initial low point, update the initial low point to the initial offset as a subsequent low point. In some embodiments, the system is further enables to, before determining the low point and the high point: determine an initial low point and an initial high point in the compressed version, wherein the initial low point is an beginning chunk of the plurality of chunks and the initial high point is a final chunk of the plurality of chunks; calculate an initial average compression ratio between the initial low point and the initial high point; interpolate an initial position in the compressed version of the desired offset in the uncompressed version to identify an initial bifurcation chunk that includes the initial interpolated position; read an initial offset of the initial bifurcation chunk; and in response to determining that the desired offset is not within the threshold distance of the initial offset and the initial offset being closer to the initial high point than the desired offset is to the initial high point, update the initial high point to the initial offset as a subsequent high point.

According to one embodiment of the present invention, a computer-readable storage medium having computer-readable program code embodied therewith for interpolation search to find arbitrary offsets in a compressed stream is provided, the computer-readable program code executable by one or more computer processors to: determine a low point and a high point in an uncompressed version of a stream corresponding to a compressed version of the stream that is divided into a plurality of chunks; calculate an average compression ratio between the low point and the high point; interpolate a position in the compressed version of a desired offset in the uncompressed version to identify a bifurcation chunk of the plurality of chunks that includes the interpolated position; read an offset of the bifurcation chunk; and in response to determining that the desired offset is within a threshold distance of the offset of the bifurcation chunk, decompress the compressed version from the bifurcation chunk until the desired offset is output. In some embodiments, the computer-readable program code is executable by one or more computer processors to, before determining the low point and the high point: determine an initial low point and an initial high point in the compressed version, wherein the initial low point is an beginning chunk of the plurality of chunks and the initial high point is a final chunk of the plurality of chunks; calculate an initial average compression ratio between the initial low point and the initial high point; interpolate an initial position in the compressed version of the desired offset in the uncompressed version to identify an initial bifurcation chunk that includes the initial interpolated position; read an initial offset of the initial bifurcation chunk; and in response to determining that the desired offset is not within the threshold distance of the initial offset and the initial offset being closer to the initial low point than the desired offset is to the initial low point, update the initial low point to the initial offset as a subsequent low point. In some embodiments, the computer-readable program code is executable by one or more computer processors to, before determining the low point and the high point: determine an initial low point and an initial high point in the compressed version, wherein the initial low point is an beginning chunk of the plurality of chunks and the initial high point is a final chunk of the plurality of chunks; calculate an initial average compression ratio between the initial low point and the initial high point; interpolate an initial position in the compressed version of the desired offset in the uncompressed version to identify an initial bifurcation chunk that includes the initial interpolated position; read an initial offset of the initial bifurcation chunk; and in response to determining that the desired offset is not within the threshold distance of the initial offset and the initial offset being closer to the initial high point than the desired offset is to the initial high point, update the initial high point to the initial offset as a subsequent high point.

DETAILED DESCRIPTION

Figure 1:
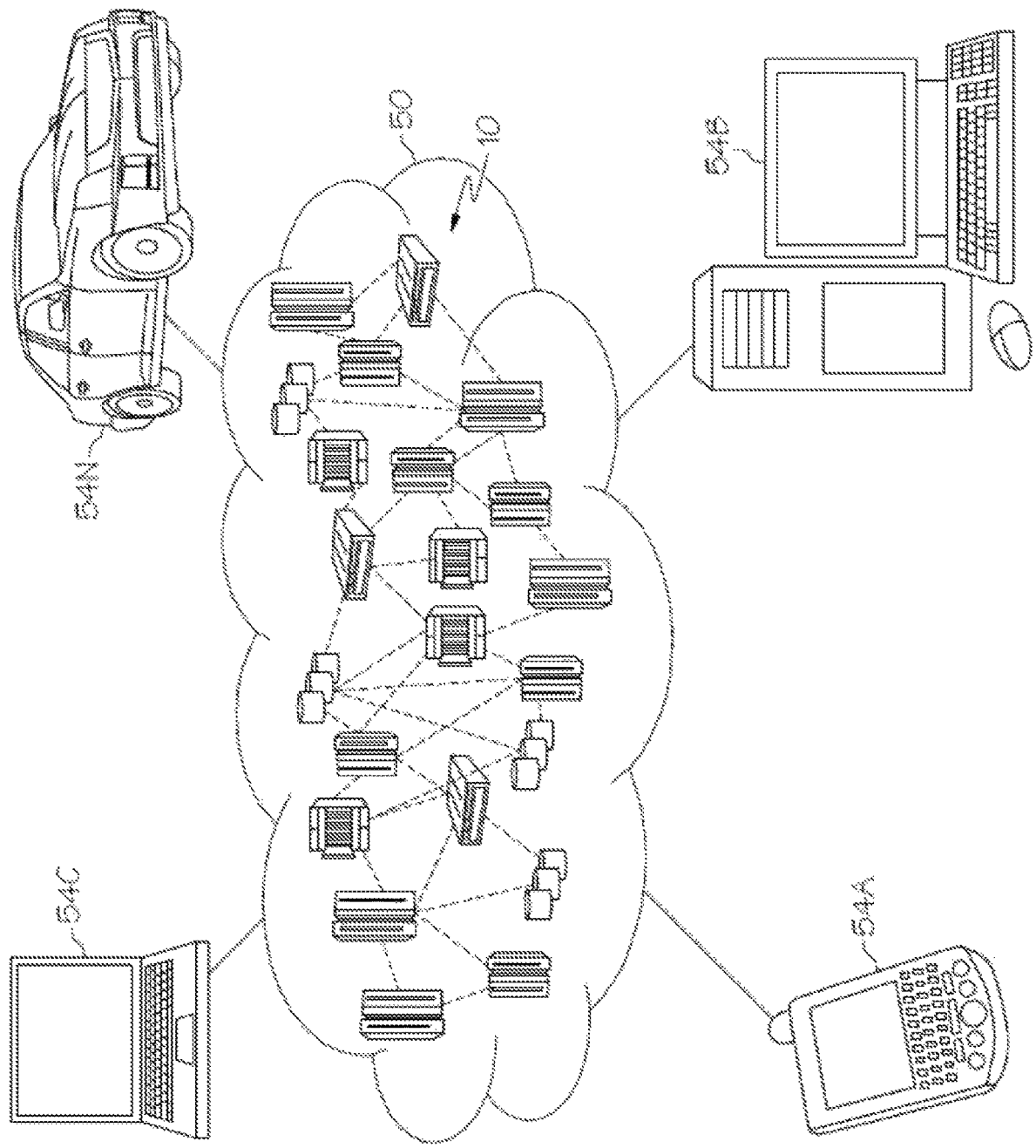
FIG. 1 depicts a cloud computing environment, according to embodiments of the present disclosure.

The present disclosure provides systems and methods that improve the searchability with negligible effect on compression ratio in compressed files without requiring a separate, possibly expensive index. A compressor engine, using any one of various compression algorithms available, compresses a file from N bytes to K bytes. The K bytes of the compressed file are divided into evenly sized chunks of size k. The compression ratio of a file may vary across chunks, so that an initial chunk may describe X bytes of the original file using k bytes, while a second chunk may described Y bytes of the original file using k bytes, where $X \neq Y$. The compressor engine includes in a "header" (e.g., a beginning portion of each chunk) the offset in the original file that the chunk encodes to, which an interpolative search algorithm can use to navigate and identify where a desired section of the uncompressed file is located within the compressed file. The only requirement from the compression algorithm is the ability to decompress starting at the beginning of each such chunk of k bytes.

The interpolative search algorithm uses the known size k of the chunks as "entry points" to navigate to particular chunks on the storage medium on which the compressed file is stored. For example, knowing that the chunks are of size k and that the compressed file begins at location X with $chunk_0$, $chunk_x$ can be found at location $X+x*k$. The interpolative search algorithm identifies two points in the compressed file (e.g., a low point L and a high point H) and determines the average compression ratio $C_{avg}$ between those two points using the compressed position given by $x*k$ and the uncompressed position stored in the headers of $chunk_L$ and $chunk_H$. The interpolative search algorithm identifies a chunk in the series of chunks that is estimated to include the position in the compressed file of the desired offset in the uncompressed file based on the average compression ratio $C_{avg}$. This estimated chunk can be used to divide the series of chunks into two sections (i.e., as "bifurcation" $chunk_B$ between L and H) such that if the estimated $chunk_B$ does not include the corresponding offset in the uncompressed file, the interpolative search algorithm can determine whether to search the chunks before or after the bifurcation $chunk_B$ in a subsequent search iteration.

If the header of the bifurcation $chunk_B$ indicates that the $chunk_B$ encodes data within a threshold distance of the desired offset, the interpolative search algorithm indicates to the compressor engine to decompress the file starting with $chunk_B$ until the desired offset is read from the decompressed file. Otherwise, when the header of the bifurcation $chunk_B$ indicates that the $chunk_B$ encodes data outside a threshold distance of the desired offset, the interpolative search algorithm iterates the search by substituting one of the current low point L or high point H with the offset of the current bifurcation $chunk_B$, and identifying a new average compression ratio $C_{avg}$ to identify a new bifurcation $chunk_B$.

The interpolative search algorithm may thus iterate through the compressed file until the position in the compressed file encoding the desired offset is identified. The bifurcation chunk$_B$ is the chunk within chunks$_{L-H}$ that the interpolative search algorithm has determined to most likely to encode the desired offset based on the average compression ratio $C_{avg}$ across chunks$_{L-H}$. The bifurcation chunk$_B$ divides the compressed file into two sets of chunks (e.g., X chunks between chunk$_L$ and chunk$_B$ and Y chunks between chunk$_B$ and chunk$_H$, where X and Y may be equal or unequal based on $C_{avg}$), which is used to reduce the set of chunks searched in a subsequent iteration. Accordingly, the complexity to return a desired offset by the interpolative search engine may be expressed as taking $\log_2(\log_2(K/k))$ or fewer iterations, where K is the size in bytes of the compressed file and k is the size in bytes of the chunks used to compress that file. Stated differently, the interpolative search engine may return the correct chunk in one iteration if the compression rating is constant and in various fortuitous cases with variable compression ratings, but may take anywhere from two to $\log_2(\log_2(K/k))$ iterations under more typical conditions with variable compression ratings. The theoretical worst-case for interpolation search happens when the sorted values being searched increase exponentially—which cannot happen with compression ratings. One of ordinary skill in the art will appreciate that the upper bound in the number of iterations of the presently described interpolative search engine is less than that provided by other search strategies, and accordingly that users are provided a computationally more efficient way to compress and store files, and to retrieve specific information from the stored files.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows: On-demand self-service: a cloud consumer can unilaterally provision computing capabilities, such as server time and network storage, as needed automatically without requiring human interaction with the service's provider. Broad network access: capabilities are available over a network and accessed through standard mechanisms that promote use by heterogeneous thin or thick client platforms (e.g., mobile phones, laptops, and PDAs). Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter). Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time. Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows: Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings. Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations. Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows: Private cloud: the cloud infrastructure is operated solely for an organization. It may be managed by the organization or a third party and may exist on-premises or off-premises. Community cloud: the cloud infrastructure is shared by several organizations and supports a specific community that has shared concerns (e.g., mission, security requirements, policy, and compliance considerations). It may be managed by the organizations or a third party and may exist on-premises or off-premises. Public cloud: the cloud infrastructure is made available to the general public or a large industry group and is owned by an organization selling cloud services. Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 1, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
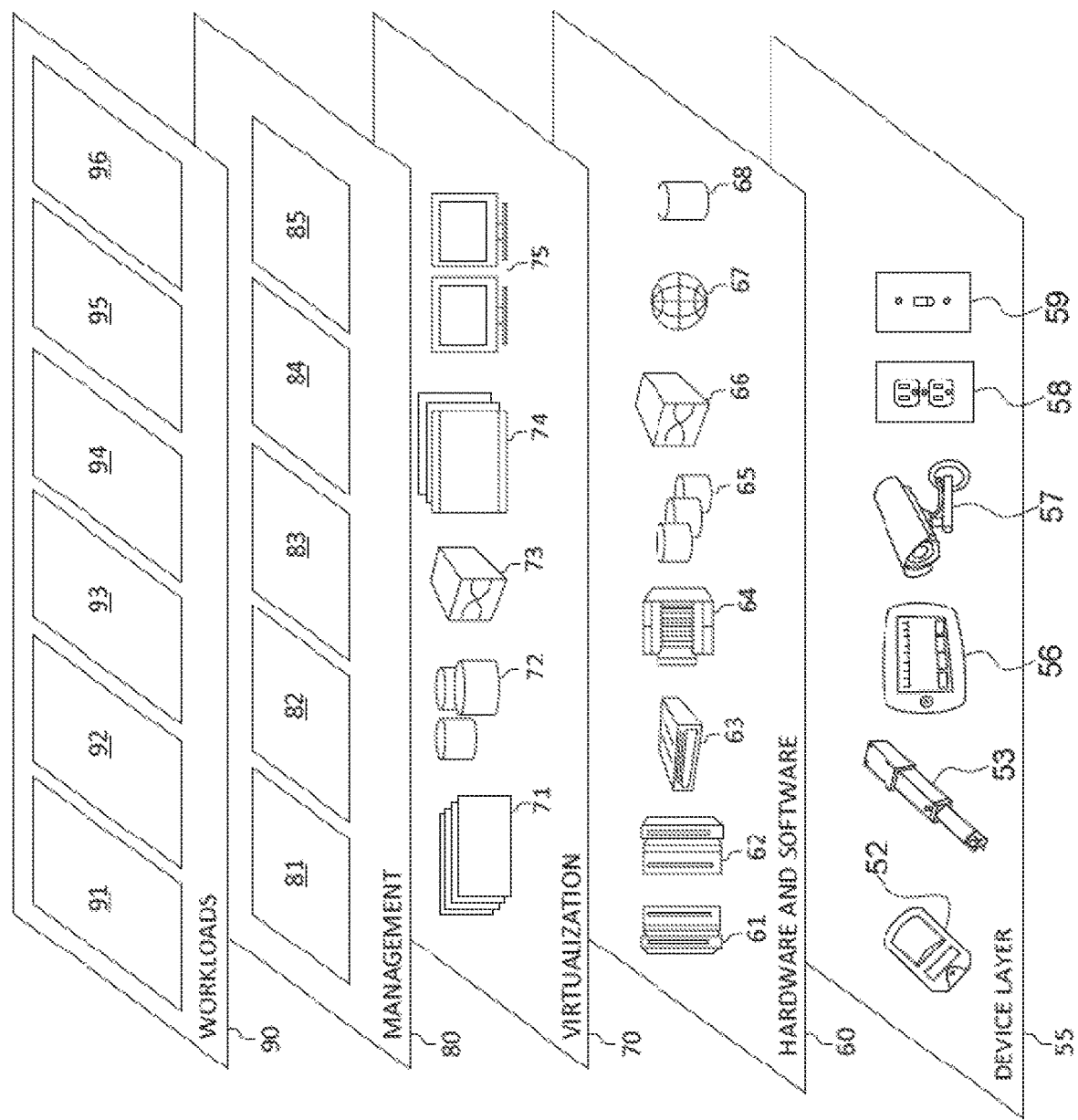
FIG. 2 depicts abstraction model layers, according to embodiments of the present disclosure.

Referring now to FIG. 2, a set of functional abstraction layers provided by cloud computing environment 50 (FIG. 1) is shown. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and class balancing training datasets for intent authoring using search 96.

Figure 3:
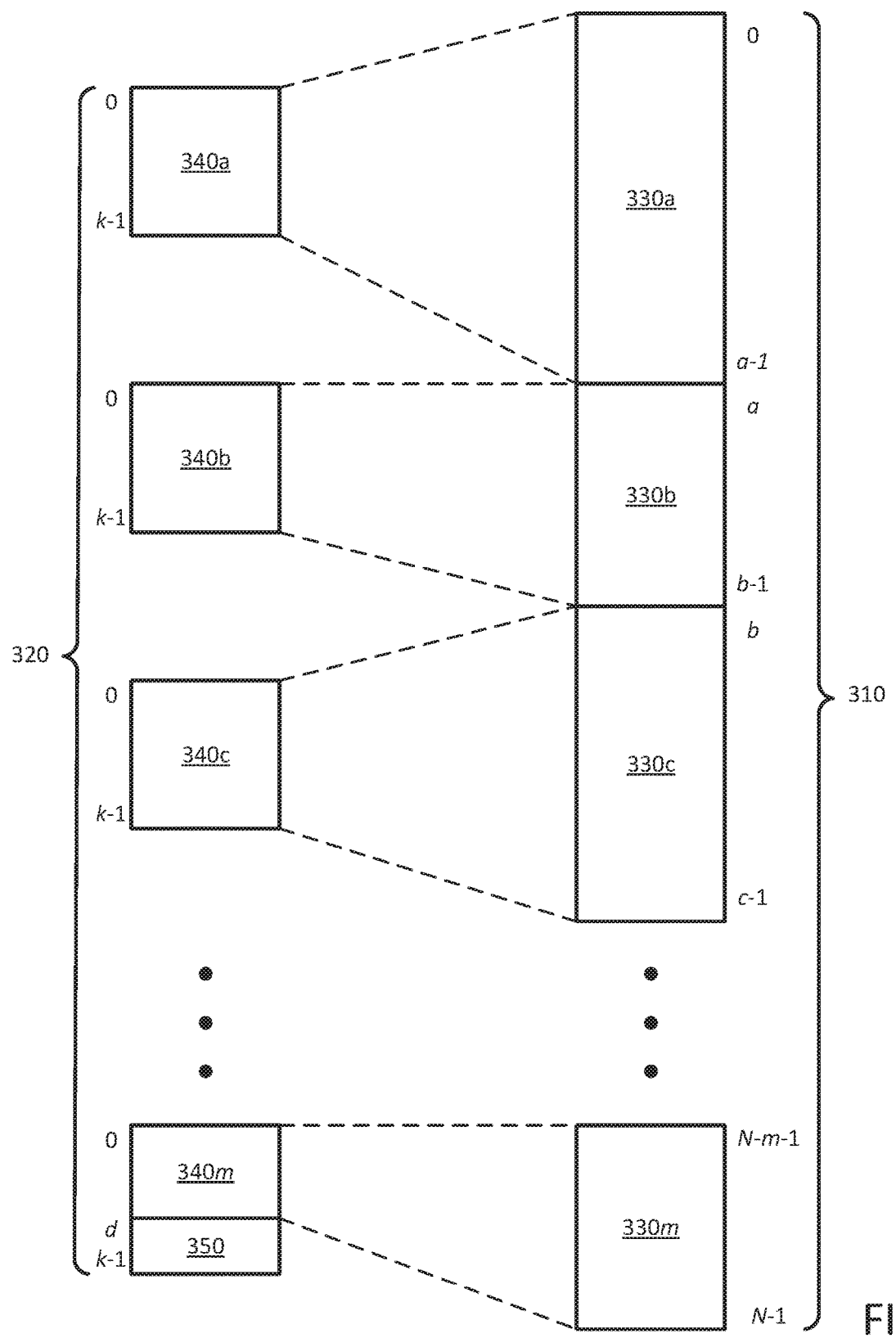
FIG. 3 illustrates a file or data stream, according to embodiments of the present disclosure.

FIG. 3 illustrates a file or data stream 300, according to embodiments of the present disclosure. The data stream 300 may be provided in an uncompressed version (referred to herein as an original, decompressed, or uncompressed stream 310) and in a compressed version (referred to herein as a compressed stream 320). The compressed stream 320 includes several chunks 340a-m (generally, chunk 340) that correspond to several portions 330a-m (generally, portion 330) of the uncompressed stream 310. An uncompressed stream 310 of N bytes may thus be stored in a memory storage device as the compressed stream 320 of K bytes, where K<N to conserve computing resources.

Each chunk 340 in the compressed stream 320 contains the same number of bytes (referred to herein as k bytes), but may represent a different number of bytes n of the N bytes of the uncompressed stream 310, and thus exhibits a unique compression ratio C. For example, a first portion 330a of a bytes includes $byte_0$ to $byte_{(a-1)}$ of the uncompressed stream 310, a second portion 330b of b bytes includes $byte_a$ to $byte_{(b-1)}$, a third portion 330c of c bytes includes $byte_b$ to $byte_{(c-1)}$, etc. Accordingly, the first chunk 340a compresses the a bytes of first portion 330a into k bytes at a first compression ratio $C_a=a/k$, the second chunk 340b compresses the b bytes of second portion 330b into k bytes at a second compression ratio $C_b=b/k$, the third chunk 340c compresses the c bytes of third portion 330c into k bytes at a third compression ratio $C_c=c/k$, etc.

A final portion 330m of size m within an uncompressed stream 310 of N bytes represents $byte_{(N-m-1)}$ through $byte_{(N-1)}$ of the uncompressed stream 310 (i.e., the final m of N bytes). Depending on the compression algorithm used and the size m of the final portion 330m, the final chunk 340m may encode the final portion 330m using fewer than k bytes, and include a padding section 350 of d bytes (e.g., of all zeroes, all ones, or some other known pattern) to fill the final chunk 340m to the full k bytes. In various embodiments, the final compression ratio $C_m$ may be defined according to the un-padded section of the final chunk 340m or the total size of the final chunk 340m as $C_m=m/(k-d)$ or $C_m=m/k$ respectively.

Each chunk 340 includes an initial or header section that indicates what offset in the uncompressed stream 310 the given chunk 340 encodes to. For example. The header of the first chunk 340a indicates that the first byte after the header corresponds to an offset of 0 in the uncompressed stream 310, while the header of the second chunk 340b indicates that the first byte after that header corresponds to an offset of a bytes in the uncompressed stream 310 (i.e., the beginning of the second portion 330b), the header of the third chuck 340c indicates that the first byte after that header corresponds to an offset of b bytes in the uncompressed stream 310 (i.e., the beginning of the third portion 330c), etc.

Once the compressed stream 320 is stored, for a user to read data from the stream 300, the user needs to identify a position P in the compressed stream 320 that corresponds to the desired offset O in the uncompressed stream 310, and decompress that position P to read the data at the desired offset O. Based on an interpolative search algorithm using the header information in the chunks 340 as described herein, the user can quickly identify which chunk 340 contains position P to decompress and read the desired uncompressed data from the desired offset O.

Figure 4:
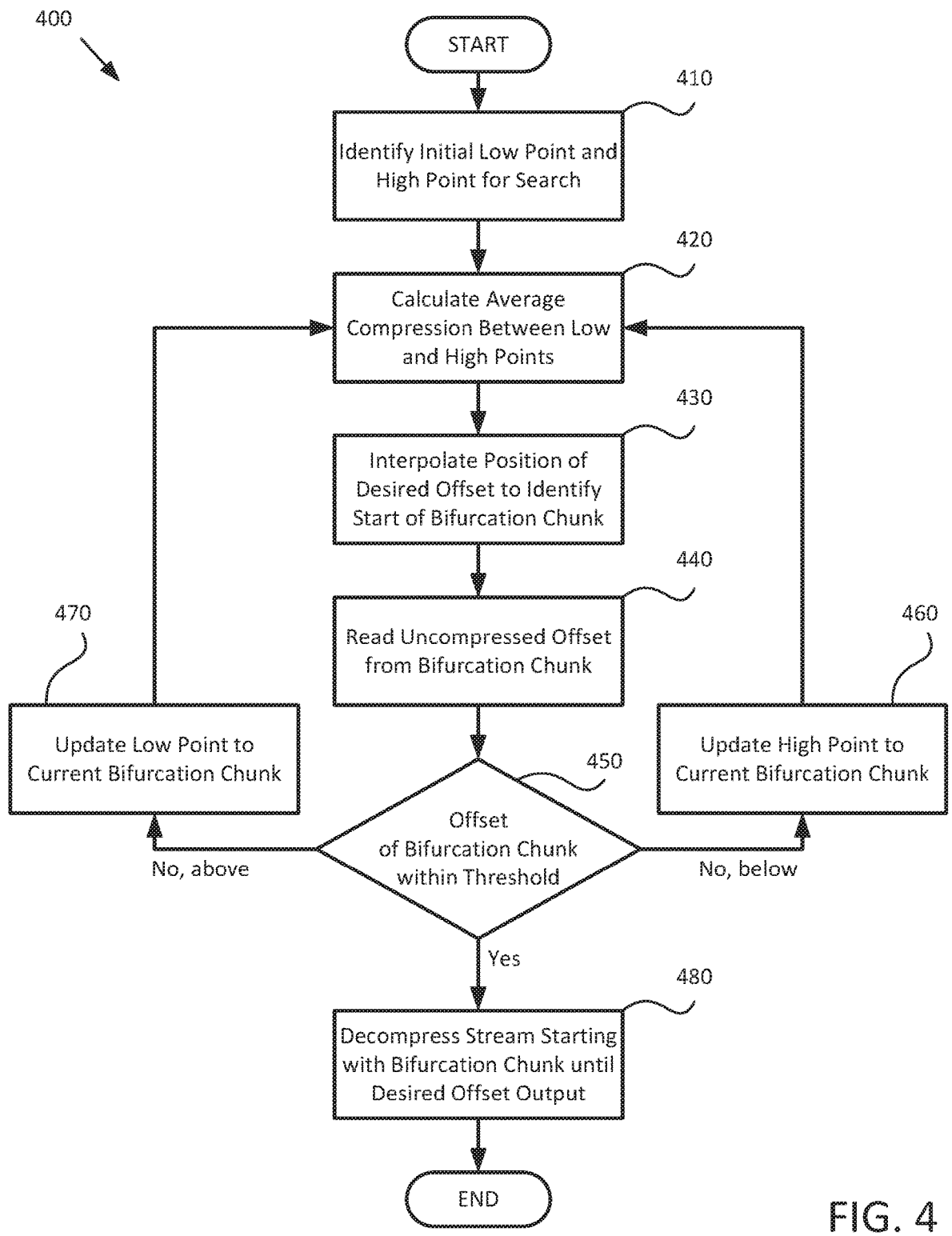
FIG. 4 is a flowchart of a method of interpolative search of a compressed data stream or file for a desired offset in a corresponding uncompressed data stream or file, according to embodiments of the present disclosure

FIG. 4 is a flowchart of a method 400 of interpolative search of a compressed data stream or file for a desired offset in a corresponding uncompressed data stream or file, according to embodiments of the present disclosure. Method 400 begins at block 410, where the interpolative search system identifies an initial low point ($L_0$) and an initial high point ($H_0$) in a compressed data stream 320 to search. The initial low point $L_0$ corresponds to the first $byte_0$ of the uncompressed data stream 310, and the initial high point $H_0$ corresponds to $byte_{(N-m-1)}$ in the uncompressed data stream 310. As method 400 iterates, the initial low point $L_0$ and/or initial high point $H_0$ may remain set to the respective prior values (e.g., $L_{(x+1)}=L_x=L_{(x-1)}$) or may be updated to represent different values (e.g., $H_{(x+1)} \neq H_x \neq H_{(x-1)}$) as is described in greater detail in regard to block 460 and block 470.

At block 420, the interpolative search system calculates the average compression ratio $C_{avg}x$ between the current low point $L_x$ and the current high point $H_x$. For example, in the initial iteration, the interpolative search system reads the header information of the final chunk 340m to identify the initial high point $H_0$ to be $byte_{(N-m-1)}$. In various embodiments, the interpolative search algorithm locates the last chunk's header based on the known file size K of the compressed stream 320, and chunk size k (e.g., as K modulo k) to find the offset information in memory for the last chunk 340m. As will be appreciated, the first chunk 340a corresponds to the first portion 330a of the uncompressed stream 310, and therefore $byte_0$ in the first chunk 340a is known to correspond to the first $byte_0$ in the uncompressed stream 310 for the initial low point $L_0$. The interpolative search algorithm uses the difference between the initial low point $L_0$ and initial high point $H_0$ (e.g., $A(byte_{(N-1)}, byte_0)=N$) and the known number of bytes included within the corresponding first chunk 340a through last chunk 340m (less any bytes in a padding section 350) to determine the initial average compression ratio $C_{avg\_0}$ in the first through last chunks 340a-m (e.g., $C_{avg\_0}=N/K$).

At block 430, the interpolative search system interpolates the position P within the compressed stream 320 to identify the header of a bifurcation chunk 340 (also referred to as $chunk_{B\_x}$ for an $x^{th}$ iteration of method 400 or generally $chunk_B$) estimated to include the interpolated position P. The interpolated position $P_x$ is estimated based on the desired offset O and the average compression ratio $C_{avg\_x}$ for the given iteration, where $P_x=O*C_{avg\_x}$. The start position of the bifurcation $chunk_{B\_x}$ that includes the estimated position $P_x$ is identified to being at position (P−(P modulo k)) in the compressed stream 320.

For example, in a stream 300 with an average compression ratio $C_{avg\_0}$ of 2:1, an offset of 3022 bytes in the uncompressed stream 310 is interpolated to be at position 1511 bytes in the compressed stream 320. The start of the bifurcation $chunk_{B\_x}$ that includes the $1511^{th}$ byte, if the example stream 300 were to use 256-byte chunks 340 (i.e., k=256 bytes), the start of the bifurcation $chunk_{B\_x}$ would therefore begin at the $1280^{th}$ byte in the compressed stream 320 (i.e., 1511−(1511 mod 256)=1280), which is in the fifth chunk 340e.

As will be appreciated, the compression ratio $C_x$ of an individual chunk 340x may vary from the average compression ratio $C_{avg}$ of several chunks 340 that include the individual chunk 340x. Accordingly, the bifurcation $chunk_B$, although estimated to include the position P corresponding to the desired offset O, may not include the matching position P. However, even if the estimated bifurcation $chunk_B$ does not include the desired offset O, by determining an estimated position P, the interpolative search system can more efficiently divide the set of chunks 340 for a subsequent iteration than if the bifurcation $chunk_B$ were identified as the middle chunk 340 in the series of chunks 340, as is done in a typical binary search. Instead, the bifurcation $chunk_B$ may divide the series of chunks 340 into unevenly divided subsets (i.e., X chunks 340 before the bifurcation $chunk_B$ and Y chunks after the bifurcation $chunk_B$, where X Y) where the estimated position P is used to. Accordingly, while a binary search algorithm can return a result within $log_2(K/k)$ or fewer attempts, the interpolative search algorithm described herein returns a result within $log_2(log_2(K/k))$ or fewer attempts; resulting in a lower upper bound for the search, and associated expected savings in computational resources.

At block 440, the interpolative search algorithm reads the bifurcation offset B in the header information of the bifurcation $chunk_{B\_x}$ correlated to the uncompressed stream 310. For example, if the third chunk 340c from FIG. 3 were identified as the bifurcation $chunk_{B\_x}$, $byte_{(c-1)}$ would be identified as the bifurcation offset B (i.e., the beginning of the chunk 340 determined to be the bifurcation $chunk_B$).

At block 450, the interpolative search system compares the difference between the bifurcation offset B and the desired offset O against a distance threshold T. When |B−O|<T, method 400 proceeds to block 480, as the desired offset O is within the distance threshold T. When |B−O|>T and B>O, the desired offset O is more than T bytes earlier in the uncompressed stream 310 from the bifurcation offset B, and method 400 proceeds to block 470. When |B−O|>T and B<O, the desired offset O is more than T bytes later in the uncompressed stream 310 from the bifurcation offset B, and method 400 proceeds to block 460.

In a best-case scenario, such as when the average compression ratio matches the actual compression (e.g., when compression is completely uniform), the desired offset O can be found at the interpolated position P. As will be appreciated, however, the compression ratio within a file can vary across the file, as different portions of the file are more or less compressible for various reasons, which may impose variations between the interpolated position P and the corresponding offset B in the uncompressed stream 310. Accordingly, the threshold T is set, such as according to method 500 described in relation to FIG. 5 herein, to determine whether the offset B is "close enough" to O to warrant decompressing the stream from the current bifurcation chunk (per block 480) or "far enough" from the desired offset O to warrant performing another analysis of the compressed stream 320 (per block 460 or block 470) to identify a new chunk 340 that compresses a portion 330 closer to the desired offset O. For example, if the bifurcation offset B is within less than k bytes of the desired offset O, the desired offset O is either in the current bifurcation $chunk_{B\_x}$ or an adjacent chunk 340, and reading the chunks 340 may be less computationally intensive that performing an additional search iteration (i.e., a user would receive results faster by using brute-force analysis of the adjacent chunks 340 to find the desired offset O than if an additional search iteration were performed).

If subsequent iterations of the initial iteration are needed, the bifurcation offset B of the immediately prior iteration is used to update one of the low point $L_x$ or the high point H. For example, at block 460 when |B−O|>T and B<O, the interpolative search system leaves the value of the low point the same such that $L_x=L_{(x+1)}$, but updates the value of the high point from $H_x$ to $H_{(x+1)}=B_x$. In another example, at block 470 when |B−O|>T and B>O, the interpolative search system leaves the value of the high point the same such that $H_x=H_{(x+1)}$, but updates the value of the low point from $L_x$ to $L_{(x+1)}=B_x$. Accordingly, when method 400 returns to block 420 from either block 460 or block 470, the set of chunks 340 over which the interpolative search system searches in the next iteration is reduced compared to the earlier set of chunks 340.

At block 480, once the interpolative search system determines that |B−O|<T, the interpolative search system decompresses the compressed stream starting at the beginning of the bifurcation $chunk_{B\_x}$ until the desired offset O appears in the decompressed output. Method 400 may then conclude.

Figure 5:
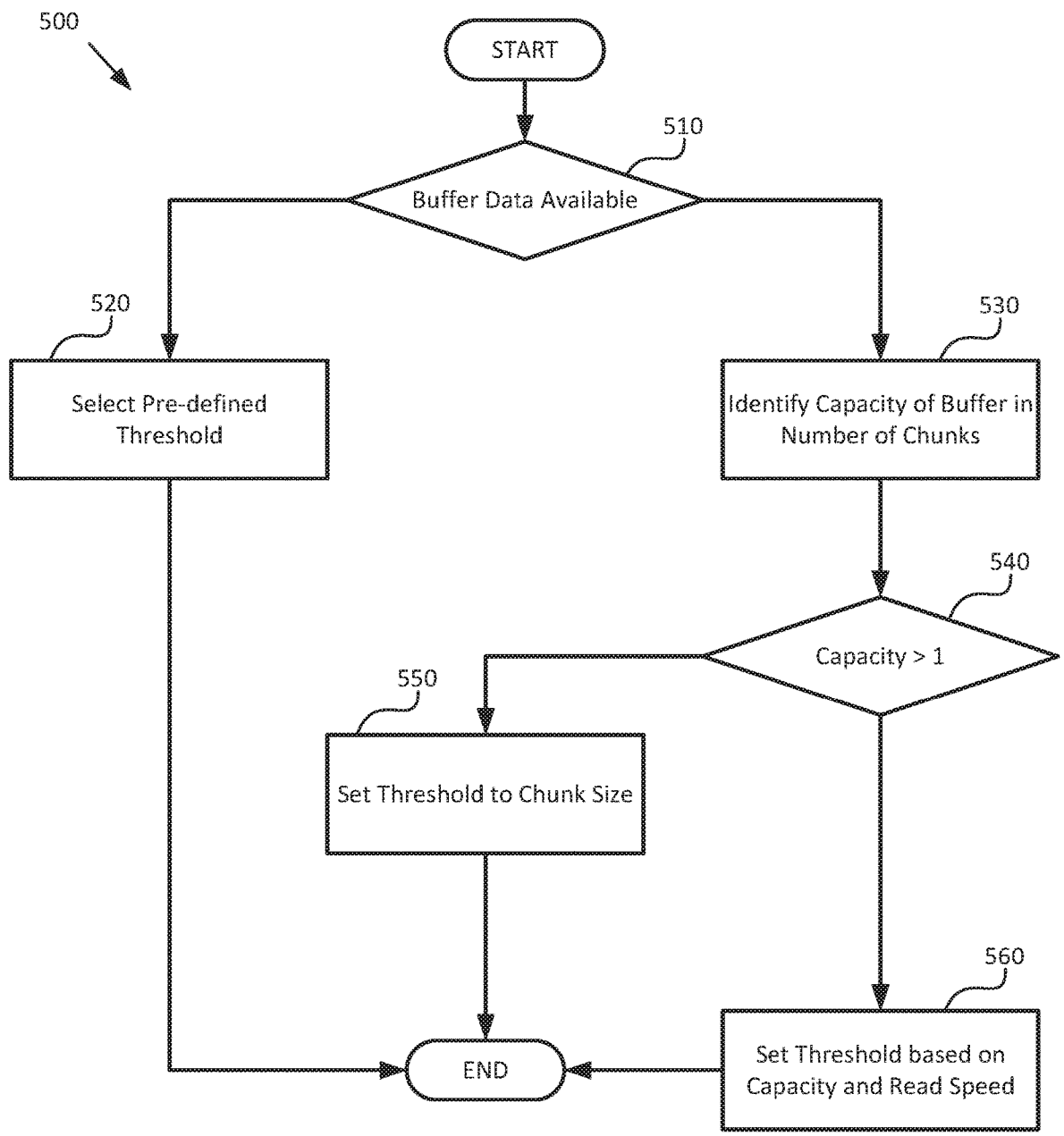
FIG. 5 is a flowchart of a method for setting a threshold, according to embodiments of the present disclosure.

FIG. 5 is a flowchart of a method 500 for setting a threshold T to determine whether a bifurcation offset B in the uncompressed stream 310 as identified from the bifurcation chunk B is "close enough" to the desired offset O, according to embodiments of the present disclosure. Because the compressed stream 320 is stored, often on a device including a long-term storage medium that takes longer to access than a short-term memory medium (e.g., a hard disk versus a buffer, cache, or other short-term memory device) that can be manipulated and analyzed by a processor, a user may set a threshold T to reduce the number of calls to the long-term memory and to maximize the use of data already read from the long-term memory into the short-term memory to further improve the speed at which the interpolative search system identified the desired offset O.

Method 500 begins at block 510, where the interpolative search system determines whether data describing the buffer or cache are available for how the compressed stream 320 is being read from the long-term memory. For example, when reading the compressed stream 320 from a local hard drive or other long-term computer storage device, the interpolative search system may have access (e.g., via a file system or operating system) to how large a buffer or cache in memory is relative to the size k of the chunks 340. In another example, when receiving data from a remote storage device (e.g., a cloud storage service), the interpolative search system may not have information about the buffer or cache in that remote system, or the size of that buffer or cache may vary as several systems or different components of such systems make use of the available buffer/cache space.

When the interpolative search system does not have data available on the buffer or cache, method 500 proceeds from block 510 to block 520, where a predefined threshold is selected for T based on a number of bytes expected or estimated to be included in the buffer. In various embodiments, this predefined threshold T is matched to a number of chunks 340, so that the predefined threshold T is set to include X chunks 340 (e.g., T=X*k). Method 500 may then conclude with the predefined threshold T for use in interpolative search.

When the interpolative search system does have data available on the buffer or cache, method 500 proceeds from block 510 to block 530, where the interpolative search system identifies the capacity of the buffer in terms of a number of chunks 340. For example, if the buffer data indicate that the buffer includes Y bytes, for a chunk size of k, the interpolative search system identifies that the buffer has a capacity of Y/k (rounded down) chunks 340.

At block 540, the interpolative search system determines whether the capacity is greater than one chunk 340. If the capacity is not greater than one chunk 340, method 500 proceeds to block 550, where the threshold T is set to the size k of one chunk 340, and method 500 may then conclude.

If the capacity is greater than one chunk 340, method 500 proceeds to from block 540 to block 560, where the interpolative search system sets the threshold T based on the capacity and the speed at which the interpolative search system can decompress and read the chunks 340 and the average compression ratio $C_{avg}$ for the iteration of analysis. For example, for each iteration of the interpolative search, the threshold T can be updated as the average compression ratio $C_{avg}$ for the portion of the compressed stream 320 under analysis changes. Because one chunk 340 of k bytes contains at least k bytes of the uncompressed stream 310, the threshold T can better estimate whether the desired offset O is within $k*C_{avg}$ bytes of the bifurcation point, and the threshold may therefore be set to $X*k*C_{avg}$.

The read speed may also include the probability that the number of chunks 340 in the threshold overrun what is stored in the buffer. For example, if the interpolative search system can make a read input/output request to the long-term storage medium and read Y chunks 340 faster than the interpolative search system can run an additional search iteration, the threshold T should be set to at least $Y*k*C_{avg}$. Similarly, if the interpolative search system can decompress and read up to Z chunks 340 faster than the interpolative search system can run an additional search iteration if no read input/output request is made, the threshold T should be set to no more than $Z*k*C_{avg}$. Accordingly, according to the above examples, the interpolative search system may optimize the value set for T between $Y*k*C_{avg}$ and $Z*k*C_{avg}$ per various user preferences, and method 500 may then conclude. As proportionally larger thresholds T relative to the capacity increase the probability that a read input/output request is needed, if there does not exist a value $Y \leq T \leq Z$, the interpolative search system may optimize T based on the capacity and chunk size to probabilistically optimize search times (e.g., find a value T in which a given percentage of cases a value $Y \leq T \leq Z$ exists), and method 500 may then conclude.

Figure 6:
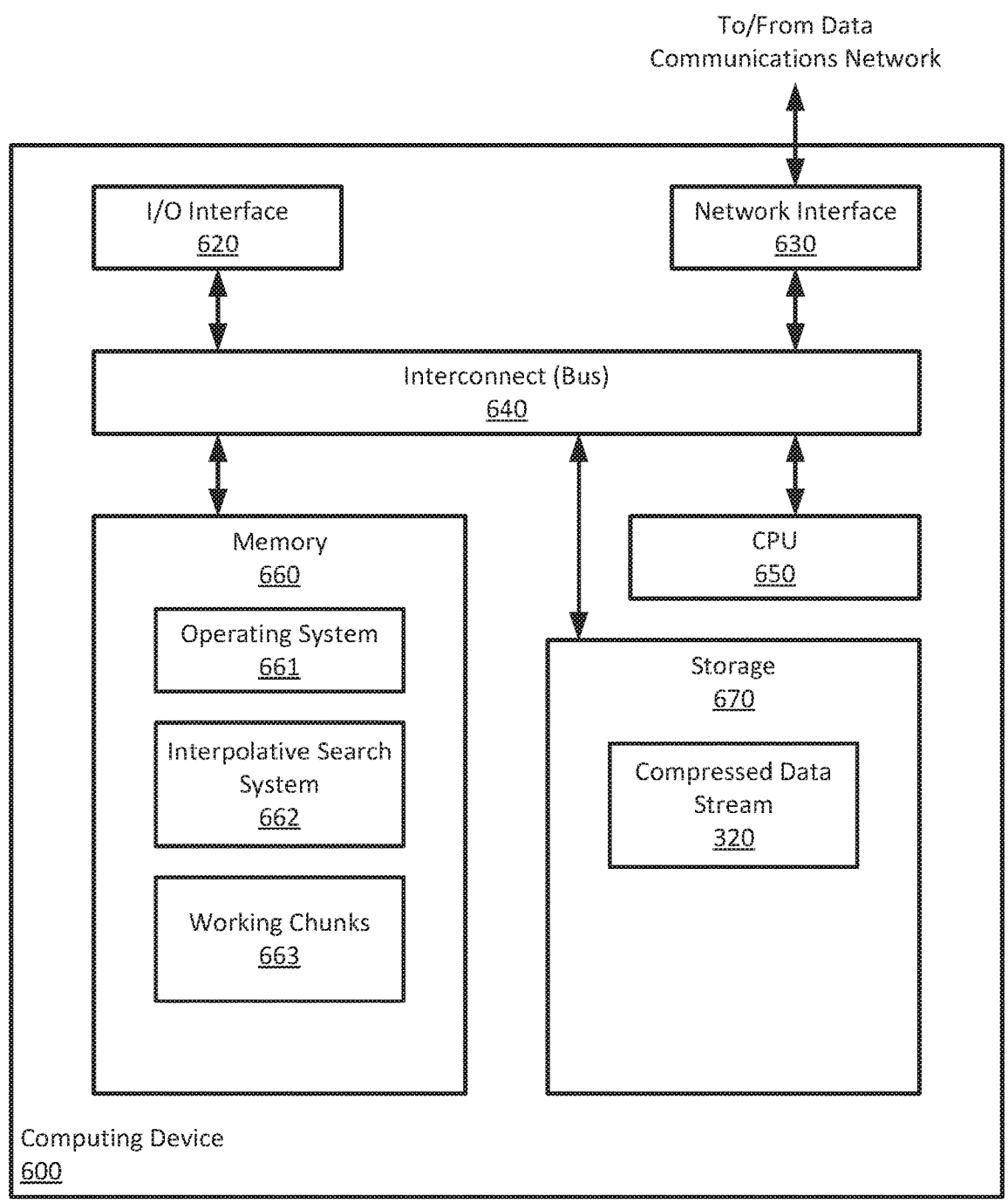
FIG. 6 illustrates a computing system, according to embodiments of the present disclosure.

FIG. 6 illustrates a computing system 600, such as a server 71 providing workloads 90 to various clients. As shown, the computing system 600 includes, without limitation, a central processing unit (CPU) 650, a network interface 630, an interconnect 640, a memory 660, and storage 670. The computing system 600 may also include an I/O device interface 620 connecting I/O devices 610 (e.g., keyboard, display and mouse devices) to the computing system 600.

The CPU 650 retrieves and executes programming instructions stored in the memory 660. Similarly, the CPU 650 stores and retrieves application data residing in the memory 660. The interconnect 640 facilitates transmission, such as of programming instructions and application data, between the CPU 650, I/O device interface 620, storage 670, network interface 640, and memory 660. CPU 650 is included to be representative of a single CPU, a microprocessor, multiple CPUs, a single CPU having multiple processing cores, and the like. And the memory 660 is generally included to be representative of a random access memory. The storage 670 may be a disk drive storage device. Although shown as a single unit, the storage 670 may be a combination of fixed and/or removable storage devices, such as magnetic disk drives, flash drives, removable memory cards or optical storage, network attached storage (NAS), or a storage area-network (SAN). The storage 670 may include both local storage devices and remote storage devices accessible via the network interface 630.

Further, although shown as a single computing system, one of ordinary skill in the art will recognized that the components of the computing system 600 shown in FIG. 6 may be distributed across multiple computing systems connected by a data communications network.

As illustrated, the memory 660 includes an operating system 661, which may include one or more file systems, and a set of processor instructions to perform the search algorithms used in an interpolative search system 662 as described herein. The interpolative search system 662 analyzes a compressed stream 320 in the storage 670 by analyzing one or more working chunks 663 (i.e., chunks 340 read from the storage 670 into the memory 660 (including buffers or caches of the storage 670) and data transmitted over the network interface 630 from remote storage devices).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method, comprising:
   determining a low point and a high point in an uncompressed version of a stream corresponding to a compressed version of the stream that is divided into a plurality of chunks;
   calculating an average compression ratio between the low point and the high point;
   interpolating a position in the compressed version of a desired offset in the uncompressed version to identify a bifurcation chunk of the plurality of chunks that includes the interpolated position;
   reading an offset of the bifurcation chunk; and
   in response to determining that the desired offset is within a threshold distance of the offset of the bifurcation chunk, decompressing the compressed version from the bifurcation chunk until the desired offset is output.

2. The method of claim 1, wherein each chunk of the plurality of chunks includes in a header an offset in the uncompressed stream to which that chunk includes correspondingly compressed data.

3. The method of claim 1, further comprising, before determining the low point and the high point:
   determining an initial low point and an initial high point in the compressed version, wherein the initial low point is an beginning chunk of the plurality of chunks and the initial high point is a final chunk of the plurality of chunks;
   calculating an initial average compression ratio between the initial low point and the initial high point;
   interpolating an initial position in the compressed version of the desired offset in the uncompressed version to identify an initial bifurcation chunk that includes the initial interpolated position;
   reading an initial offset of the initial bifurcation chunk; and
   in response to determining that the desired offset is not within the threshold distance of the initial offset and the initial offset being closer to the initial low point than the desired offset is to the initial low point, updating the initial low point to the initial offset as a subsequent low point.

4. The method of claim 1, further comprising, before determining the low point and the high point:
   determining an initial low point and an initial high point in the compressed version, wherein the initial low point is an beginning chunk of the plurality of chunks and the initial high point is a final chunk of the plurality of chunks;
   calculating an initial average compression ratio between the initial low point and the initial high point;
   interpolating an initial position in the compressed version of the desired offset in the uncompressed version to identify an initial bifurcation chunk that includes the initial interpolated position;
   reading an initial offset of the initial bifurcation chunk; and
   in response to determining that the desired offset is not within the threshold distance of the initial offset and the initial offset being closer to the initial high point than the desired offset is to the initial high point, updating the initial high point to the initial offset as a subsequent high point.

5. The method of claim 4, wherein a final chunk of the plurality of chunks includes a padding section and each of the chunks of the plurality of chunks are the same size, wherein determining the initial average compression ignores a size of the padding section when calculating a compression ratio between the final chunk and a corresponding final portion of the uncompressed version of the stream.

6. The method of claim 1, wherein the threshold is set to a size based on a predefined number of chunks.

7. The method of claim 1, wherein the threshold is set based on a buffer size from which chunks of the plurality of chunks are read and a read speed from the buffer.

8. A system, comprising:
   a processor; and
   a memory storage device including instructions that when executed by the processor enable the system to:
      determine a low point and a high point in an uncompressed version of a stream corresponding to a compressed version of the stream that is divided into a plurality of chunks;
      calculate an average compression ratio between the low point and the high point;
      interpolate a position in the compressed version of a desired offset in the uncompressed version to identify a bifurcation chunk of the plurality of chunks that includes the interpolated position;
      read an offset of the bifurcation chunk; and
      in response to determining that the desired offset is within a threshold distance of the offset of the bifurcation chunk, decompress the compressed version from the bifurcation chunk until the desired offset is output.

9. The system of claim 8, wherein each chunk of the plurality of chunks includes in a header an offset in the uncompressed stream to which that chunk includes correspondingly compressed data.

10. The system of claim 8, before determining the low point and the high point the system is further enabled to:

determine an initial low point and an initial high point in the compressed version, wherein the initial low point is an beginning chunk of the plurality of chunks and the initial high point is a final chunk of the plurality of chunks;

calculate an initial average compression ratio between the initial low point and the initial high point;

interpolate an initial position in the compressed version of the desired offset in the uncompressed version to identify an initial bifurcation chunk that includes the initial interpolated position;

read an initial offset of the initial bifurcation chunk; and in response to determining that the desired offset is not within the threshold distance of the initial offset and the initial offset being closer to the initial low point than the desired offset is to the initial low point, update the initial low point to the initial offset as a subsequent low point.

11. The system of claim 8, before determining the low point and the high point the system is further enabled to:

determine an initial low point and an initial high point in the compressed version, wherein the initial low point is an beginning chunk of the plurality of chunks and the initial high point is a final chunk of the plurality of chunks;

calculate an initial average compression ratio between the initial low point and the initial high point;

interpolate an initial position in the compressed version of the desired offset in the uncompressed version to identify an initial bifurcation chunk that includes the initial interpolated position;

read an initial offset of the initial bifurcation chunk; and in response to determining that the desired offset is not within the threshold distance of the initial offset and the initial offset being closer to the initial high point than the desired offset is to the initial high point, update the initial high point to the initial offset as a subsequent high point.

12. The system of claim 11, wherein a final chunk of the plurality of chunks includes a padding section and each of the chunks of the plurality of chunks are the same size, wherein determining the initial average compression ignores a size of the padding section when calculating a compression ratio between the final chunk and a corresponding final portion of the uncompressed version of the stream.

13. The system of claim 8, wherein the threshold is set to a size based on a predefined number of chunks.

14. The system of claim 8, wherein the threshold is set based on a buffer size from which chunks of the plurality of chunks are read and a read speed from the buffer.

15. A computer-readable storage medium having computer-readable program code embodied therewith, the computer-readable program code executable by one or more computer processors to:

determine a low point and a high point in an uncompressed version of a stream corresponding to a compressed version of the stream that is divided into a plurality of chunks;

calculate an average compression ratio between the low point and the high point;

interpolate a position in the compressed version of a desired offset in the uncompressed version to identify a bifurcation chunk of the plurality of chunks that includes the interpolated position;

read an offset of the bifurcation chunk; and in response to determining that the desired offset is within a threshold distance of the offset of the bifurcation chunk, decompress the compressed version from the bifurcation chunk until the desired offset is output.

16. The computer-readable storage medium of claim 15, wherein each chunk of the plurality of chunks includes in a header an offset in the uncompressed stream to which that chunk includes correspondingly compressed data.

17. The computer-readable storage medium of claim 15, before determining the low point and the high point the computer-readable program code is executable by one or more computer processors to:

determine an initial low point and an initial high point in the compressed version, wherein the initial low point is an beginning chunk of the plurality of chunks and the initial high point is a final chunk of the plurality of chunks;

calculate an initial average compression ratio between the initial low point and the initial high point;

interpolate an initial position in the compressed version of the desired offset in the uncompressed version to identify an initial bifurcation chunk that includes the initial interpolated position;

read an initial offset of the initial bifurcation chunk; and in response to determining that the desired offset is not within the threshold distance of the initial offset and the initial offset being closer to the initial low point than the desired offset is to the initial low point, update the initial low point to the initial offset as a subsequent low point.

18. The computer-readable storage medium of claim 15, before determining the low point and the high point the computer-readable program code is executable by one or more computer processors to:

determine an initial low point and an initial high point in the compressed version, wherein the initial low point is an beginning chunk of the plurality of chunks and the initial high point is a final chunk of the plurality of chunks;

calculate an initial average compression ratio between the initial low point and the initial high point;

interpolate an initial position in the compressed version of the desired offset in the uncompressed version to identify an initial bifurcation chunk that includes the initial interpolated position;

read an initial offset of the initial bifurcation chunk; and in response to determining that the desired offset is not within the threshold distance of the initial offset and the initial offset being closer to the initial high point than the desired offset is to the initial high point, update the initial high point to the initial offset as a subsequent high point.

19. The computer-readable storage medium of claim 18, wherein a final chunk of the plurality of chunks includes a padding section and each of the chunks of the plurality of chunks are the same size, wherein determining the initial average compression ignores a size of the padding section when calculating a compression ratio between the final chunk and a corresponding final portion of the uncompressed version of the stream.

20. The computer-readable storage medium of claim 15, wherein the threshold is set based on a buffer size from which chunks of the plurality of chunks are read and a read speed from the buffer.

* * * * *